(12) United States Patent
Chew et al.

(10) Patent No.: US 10,283,699 B2
(45) Date of Patent: May 7, 2019

(54) HALL-EFFECT SENSOR ISOLATOR

(71) Applicant: Avago Technologies International Sales Pte. Limited, Singapore (SG)

(72) Inventors: Yin Yin Chew, Singapore (SG); Thiam Siew Gary Tay, Singapore (SG); Dominique Ho, Singapore (SG)

(73) Assignee: Avago Technologies International Sales Pte. Limited, Singapore (SG)

( * ) Notice: Subject to any disclaimer, the term of this patent is extended or adjusted under 35 U.S.C. 154(b) by 229 days.

(21) Appl. No.: 15/011,167

(22) Filed: Jan. 29, 2016

(65) Prior Publication Data
US 2017/0222131 A1 Aug. 3, 2017

(51) Int. Cl.
| H01L 43/04 | (2006.01) |
| H01L 43/06 | (2006.01) |
| H01L 43/14 | (2006.01) |
| H01L 21/56 | (2006.01) |
| H01L 23/31 | (2006.01) |
| H01L 23/495 | (2006.01) |
| H01L 23/00 | (2006.01) |
| H03K 17/95 | (2006.01) |

(52) U.S. Cl.
CPC .............. *H01L 43/06* (2013.01); *H01L 21/56* (2013.01); *H01L 23/3107* (2013.01); *H01L 23/49537* (2013.01); *H01L 23/49551* (2013.01); *H01L 24/49* (2013.01); *H01L 24/85* (2013.01); *H01L 43/04* (2013.01); *H01L 43/14* (2013.01); *H03K 17/9517* (2013.01); *H01L 24/48* (2013.01); *H01L 2224/48245* (2013.01); *H01L 2224/49171* (2013.01); *H01L 2924/00014* (2013.01)

(58) Field of Classification Search
CPC .......... H01L 43/00–43/14; H01L 23/28; H01L 23/293; H01L 23/482–23/4821; H01L 23/495–23/49534; H01L 23/49537–23/49558; G01R 33/0047; G01R 33/02; G01R 33/032–33/0327; G01R 33/06–33/077; H04B 10/802
See application file for complete search history.

(56) References Cited

U.S. PATENT DOCUMENTS

| 4,160,308 | A | * | 7/1979 | Courtney | ................ | H01L 31/16 250/551 |
| 4,471,219 | A | * | 9/1984 | Giallorenzi | ............ | G02B 6/283 250/227.14 |
| 4,694,183 | A | * | 9/1987 | Merrick | ................ | H01L 31/167 250/551 |
| 4,712,017 | A | * | 12/1987 | Kamasaki | ........... | H01L 31/1113 250/551 |
| 4,875,011 | A | | 10/1989 | Namiki et al. | | |
| 4,931,719 | A | | 6/1990 | Murata et al. | | |
| 5,148,243 | A | * | 9/1992 | Merrick | ................ | H01L 31/167 250/239 |

(Continued)

*Primary Examiner* — Maliheh Malek
(74) *Attorney, Agent, or Firm* — Sheridan Ross P.C.

(57) ABSTRACT

A coupler is disclosed that employs hall-effect sensing technology. Specifically, the coupler is configured to produce an output voltage by converting the magnetic field generated by a current conductor at an input side. The output and input sides may be electrically isolated from one another but may be coupled via the hall-effect sensing technology, such as a hall-effect sensor. The output and input sides may be provided in an overlapping configuration.

20 Claims, 8 Drawing Sheets

(56) References Cited

U.S. PATENT DOCUMENTS

| | | | | |
|---|---|---|---|---|
| 5,559,340 A * | 9/1996 | Nakamura | ............ | H01L 31/167 250/214 R |
| 5,572,058 A | 11/1996 | Biard | | |
| 5,665,983 A * | 9/1997 | Nagano | ................ | H01L 31/167 257/100 |
| 5,751,009 A * | 5/1998 | Anderson | ............ | H04B 10/802 250/239 |
| 5,770,867 A * | 6/1998 | Sata | .................... | H01L 31/0203 257/787 |
| 6,588,946 B1 * | 7/2003 | Mitsui | .................. | H01L 25/167 250/239 |
| 6,879,145 B1 | 4/2005 | Harris | | |
| 7,009,166 B2 * | 3/2006 | Shoji | .................. | H01L 25/167 250/214 R |
| 7,042,208 B1 | 5/2006 | Harris | | |
| 7,116,101 B1 * | 10/2006 | Bear | ...................... | G01D 5/142 324/251 |
| 7,488,964 B2 * | 2/2009 | Horino | ................. | H01L 31/167 250/551 |
| 7,561,009 B2 * | 7/2009 | Larson, III | ............... | H03H 3/04 333/187 |
| 7,772,661 B2 | 8/2010 | Kilian | | |
| 7,948,067 B2 * | 5/2011 | Fouquet | ................ | H01L 23/495 257/666 |
| 8,013,441 B2 * | 9/2011 | Bauer | ............... | H01L 23/49524 257/665 |
| 8,248,185 B2 * | 8/2012 | Choy | ................ | H03H 9/02118 310/322 |
| 8,350,345 B2 * | 1/2013 | Vaganov | .............. | G06F 3/0338 257/415 |
| 8,427,844 B2 * | 4/2013 | Ho | ......................... | H01F 19/08 257/676 |
| 8,704,514 B2 | 4/2014 | Motz et al. | | |
| 8,902,023 B2 * | 12/2014 | Choy | ................ | H03H 9/02118 310/322 |
| 8,952,471 B2 | 2/2015 | Doogue et al. | | |
| 9,000,761 B2 * | 4/2015 | Tay | ...................... | G01R 33/072 324/251 |
| 9,231,118 B2 * | 1/2016 | Ausserlechner | ...... | G01R 15/207 |
| 9,236,954 B2 * | 1/2016 | Mitamura | ............ | H04B 10/802 |
| 9,547,024 B2 * | 1/2017 | Racz | .................. | G01R 19/0092 |
| 9,589,887 B2 * | 3/2017 | Watanabe | ............... | H01L 23/48 |
| 9,859,260 B2 * | 1/2018 | Tagami | ............ | H01L 23/49541 |
| 9,941,463 B2 * | 4/2018 | Annunziata | ............. | H01L 43/02 |
| 9,960,671 B2 * | 5/2018 | Ho | ......................... | H01L 23/48 |
| 2004/0081409 A1 * | 4/2004 | Ho | ........................ | G02B 6/10 385/92 |
| 2005/0116145 A1 * | 6/2005 | Aki | ...................... | H01L 23/552 250/214.1 |
| 2007/0025028 A1 * | 2/2007 | Chung | .................. | B82Y 25/00 360/324.2 |
| 2007/0164409 A1 * | 7/2007 | Holland | ............. | H01L 23/3107 257/678 |
| 2008/0297138 A1 | 12/2008 | Taylor et al. | | |
| 2009/0045475 A1 * | 2/2009 | Wan | ...................... | G01R 15/207 257/427 |
| 2009/0072360 A1 * | 3/2009 | Koga | ................ | H01L 23/49551 257/669 |
| 2009/0243597 A1 * | 10/2009 | Spenik | .................. | G01R 33/072 324/207.22 |
| 2010/0201356 A1 * | 8/2010 | Koller | ................ | B29C 45/0013 324/252 |
| 2010/0259909 A1 * | 10/2010 | Ho | ......................... | H01F 19/08 361/767 |
| 2010/0328902 A1 * | 12/2010 | Ho | ........................ | H01L 23/495 361/748 |
| 2011/0049693 A1 * | 3/2011 | Nakashiba | ............... | H01L 23/48 257/676 |
| 2011/0127998 A1 * | 6/2011 | Elian | ...................... | B82Y 25/00 324/219 |
| 2011/0204887 A1 * | 8/2011 | Ausserlechner | ...... | G01R 15/202 324/251 |
| 2011/0304327 A1 * | 12/2011 | Ausserlechner | ...... | G01R 15/207 324/239 |
| 2012/0038352 A1 * | 2/2012 | Elian | .................... | G01R 33/072 324/239 |
| 2013/0113114 A1 * | 5/2013 | Hosseini | .......... | H01L 23/49551 257/777 |
| 2013/0168531 A1 * | 7/2013 | Wong | .................... | G01J 1/4257 250/201.1 |
| 2013/0187644 A1 | 7/2013 | Tay et al. | | |
| 2013/0221248 A1 * | 8/2013 | Komoto | .................... | G01J 1/42 250/551 |
| 2013/0249544 A1 | 9/2013 | Vig et al. | | |
| 2013/0313447 A1 * | 11/2013 | Tay | ...................... | H01L 31/0203 250/551 |
| 2014/0070120 A1 * | 3/2014 | Mitamura | ............ | H04B 10/802 250/551 |
| 2014/0119691 A1 * | 5/2014 | Tay | .................... | H01L 31/02005 385/31 |
| 2014/0264677 A1 * | 9/2014 | Ausserlechner | ...... | G01R 15/207 257/427 |
| 2014/0333301 A1 * | 11/2014 | Racz | .................. | G01R 19/0092 324/251 |
| 2015/0041687 A1 * | 2/2015 | Matsuda | .............. | H04B 10/802 250/551 |
| 2015/0194249 A1 * | 7/2015 | Elian | ................. | H01R 13/6205 439/39 |
| 2016/0093570 A1 * | 3/2016 | Watanabe | ................ | H01L 23/48 257/531 |
| 2016/0190918 A1 * | 6/2016 | Ho | ......................... | H01L 23/48 327/530 |
| 2016/0315074 A1 * | 10/2016 | Tagami | ................. | H01L 25/167 |
| 2016/0322531 A1 * | 11/2016 | Koseki | .................... | H01L 31/16 |
| 2016/0379966 A1 * | 12/2016 | Chen | ................ | H01L 25/16 257/48 |
| 2017/0040246 A1 * | 2/2017 | Shuto | ................ | H01L 23/49541 |
| 2017/0052232 A1 * | 2/2017 | Wada | .................. | G01R 33/091 |
| 2017/0103969 A1 * | 4/2017 | Krause | .................... | H01L 23/48 |
| 2017/0138988 A1 * | 5/2017 | Ausserlechner | ...... | G01R 15/202 |
| 2017/0148751 A1 * | 5/2017 | Watanabe | ............... | H01F 38/14 |
| 2017/0170091 A1 * | 6/2017 | Kim | .................. | H01L 23/3675 |
| 2017/0179377 A1 * | 6/2017 | Milano | .................... | H01L 43/04 |
| 2017/0256479 A1 * | 9/2017 | Liu | ........................ | H01L 23/60 |
| 2017/0256507 A1 * | 9/2017 | Choe | .................... | H01L 23/66 |
| 2017/0271229 A1 * | 9/2017 | Santos | ................ | H01L 23/3114 |
| 2017/0328962 A1 * | 11/2017 | Schott | ................. | G01R 33/07 |
| 2017/0338171 A1 * | 11/2017 | Cho | ............... | H01L 23/49537 |
| 2017/0373008 A1 * | 12/2017 | Constantino | ............ | H01L 23/66 |
| 2018/0082980 A1 * | 3/2018 | Liang | .................... | H01L 21/565 |
| 2018/0090422 A1 * | 3/2018 | Araki | .................... | H01L 23/293 |
| 2018/0096920 A1 * | 4/2018 | Adriano | ............. | H01L 23/4952 |
| 2018/0102306 A1 * | 4/2018 | Cho | ................... | H01L 21/565 |
| 2018/0102307 A1 * | 4/2018 | Cho | ................... | H01L 21/4825 |
| 2018/0103541 A1 * | 4/2018 | Moncayo | ............... | H01L 23/3114 |

* cited by examiner

HALL-EFFECT SENSOR ISOLATOR

FIELD OF THE DISCLOSURE

The present disclosure is generally directed couplers and specifically those that employ hall-effect sensing technology.

BACKGROUND

Frequently in industrial applications, a high voltage and/or high current system must be monitored to ensure that the electrical power properties of the system meet select criteria, such as remaining within a voltage range, and/or remaining within a current range. Such systems frequently have power variations and fluctuations, such as transients, which can potentially damage sensitive equipment and controllers.

One solution to problems caused by transients, which is recognized in industry, is gap isolation of the controller via optocouplers, inductance couplers, capacitor couplers, or other gap isolation circuits.

By way of example, an optocoupler is an electronic device that transfers an electrical signal across an isolation gap by converting the electrical signal to optical light, and back to an electrical signal after passing through an insulation medium. The main objective of optocouplers is to provide high voltage isolation protection on the outside of the circuit, when there is a surge or spike in the voltage rating on the input side.

A typical optocoupler needs a light source, such as a Light Emitting Device (LED), a photodetector, and an insulation medium. The insulation medium of the optocoupler can be either transparent polyimide or epoxy molding compound that allow optical light to pass through.

One limitation of existing optocouplers is that they cannot take in the high current directly. Rather, the incoming current is often passed through external resistors to limit the current, thereby increasing the costs associated with implementing the optocoupler.

Other gap isolators operate similarly with a different type of signal being transmitted across the gap. For instance, an inductance coupler will convert the signal to inductance and then back into an analog electrical signal instead of using an optical signal. While such an arrangement addresses the potential problems caused by a high voltage load in direct connection with a controller, it can give rise to other problems such as scaling factors and the like.

BRIEF DESCRIPTION OF THE DRAWINGS

The present disclosure is described in conjunction with the appended figures.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

As can be seen in FIGS. 1-8, an isolation coupler 112, 200 and an electrical system 100 in which an isolation coupler 112, 200 may be employed will be described. The isolation coupler 112, 200 may be incorporated into any system which requires current and/or voltage monitoring, but is susceptible to transients. In some embodiments, the isolation coupler 112, 200 is rated to operate at about 5 kV or more.

In some embodiments, the isolation coupler 112, 200 may be configured as a hall-effect sensor coupler that can be used in high power applications (e.g., motor drives and controls). With this proposed configuration of the isolation coupler 112, 200, the input current may be allowed to flow through the low resistance metal leadframe, meaning that the current loading and heat dissipation is low. This provides some advantages as compared to optocouplers and the like.

In some embodiments, the isolation coupler 112, 200 is provided with a hall-sensing element that is constructed from a thin sheet of conductive material, and with its output connection oriented perpendicular to the current flow direction. When the hall-sensing element senses a magnetic field, it produces a voltage output that is substantially proportional to the magnetic field strength. The hall-sensing element can be miniaturized and incorporated into a semiconductor silicon level without departing from the scope of the present disclosure.

In some embodiments, to achieve a high voltage isolation feature, there is a need for an isolation/insulation material to electrically and physically separate the input side of the isolation coupler from the output side of the isolation coupler. By adding an isolation/insulation material between the current conductor and silicon, a high voltage isolation performance can be achieved, and the overall performance (e.g., voltage rating) may depend on the dielectric strength of the isolation/insulation material. In some embodiments, the isolation/insulation material can be precut to a desired shape and attached between the leadframes of the input side and the output side. In an illustrative, but non-limiting configuration, a double sided B-stage adhesive insulating tape is used for the isolation/insulation material. Use of such a tape helps to simplify the packaging process.

Figure 1:
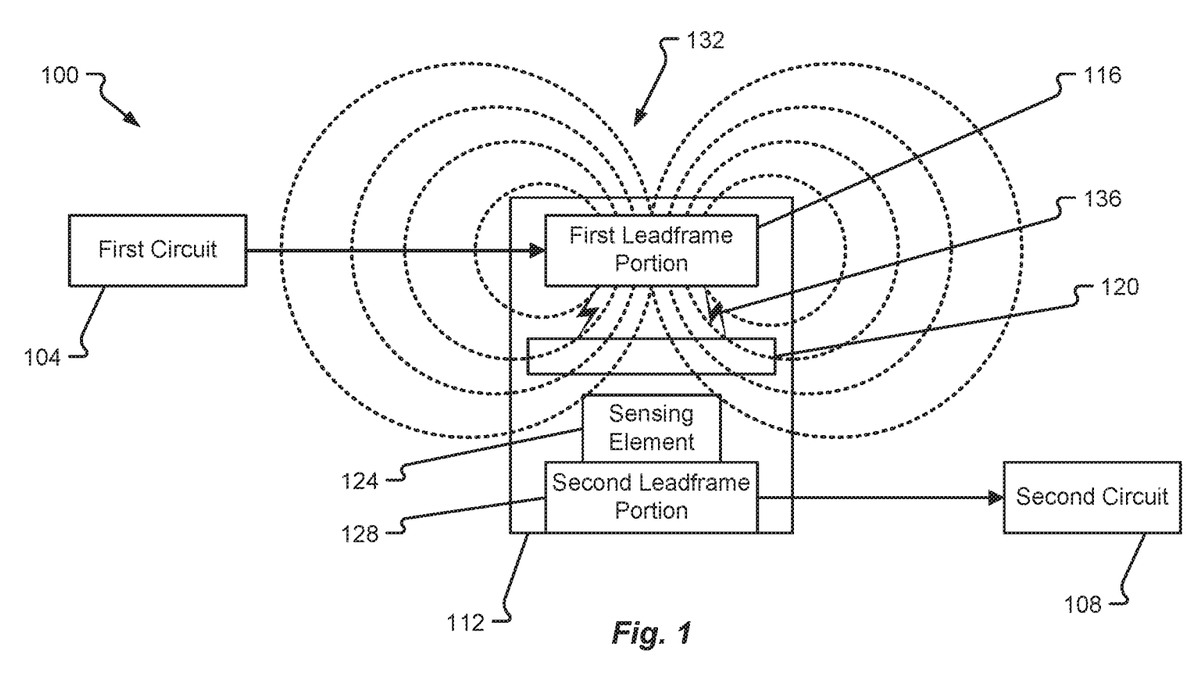
FIG. 1 is a block diagram depicting an electrical system in accordance with embodiments of the present disclosure.

Referring initially to FIG. 1, an electrical system 100 in which an isolation coupler 112 can be utilized will be described in accordance with at least some embodiments of the present disclosure. The electrical system 100 is shown to include a first circuit 104 and a second circuit 108 with the isolation coupler 112 provided therebetween. The isolation coupler 112 provides the ability to electrically isolate the first circuit 104 from the second circuit 108, while simultaneously allowing data and/or control information to pass between the circuits. To that end, the isolation coupler 112 may include a first leadframe portion 116 in electrical communication with the first circuit 104 and a second leadframe portion 128 in electrical communication with the second circuit 108. The isolation material 120 is positioned between the first leadframe portion 116 and the second leadframe portion 128, thereby substantially prohibiting electrical arcs 136 or leakage current from passing between the first leadframe portion 116 and second leadframe portion 128. Because the isolation material 120 is positioned between the leadframe portions 116, 128, there is an isolation gap established between the leadframe portions 116, 128.

In some embodiments, the first leadframe portion 116 may be configured to generate or induce a magnetic field 132 that is sensed by the sensing element 124. The magnetic field 132 induced by the first leadframe portion 116 may be proportional (directly or indirectly) to the amount of current flowing through the first leadframe portion 116 as supplied by the first circuit 104. As is known in electromagnetism, the induction of the magnetic field 132 may be caused, at least in part, by directing current through the first leadframe portion 116 in a non-linear and/or curved/arcuate path. Even more specifically, the first leadframe portion 116 may be configured to force the current flowing therethrough to flow in a curved or circular pattern. As such, the first leadframe portion 116 may create the magnetic field 132 as described by the Biot-Savart law or Ampere's law. This magnetic field 132 is detected by the sensing element 124 and converted into an electrical signal (analog or digital) that has a current which is substantially less than the current flowing through the first leadframe portion 116.

Because the magnetic field 132 represents the current flowing from the first circuit 104 to the first leadframe portion 116, the magnetic field 132 sensed by the sensing element 124 can be converted back to an electrical signal with the second leadframe portion 128. The current now created in the second leadframe portion 128 as a result of the sensing performed at the sensing element 124 is representative of the current flowing in the first leadframe portion 116 (e.g., is proportional). Thus, utilization of the magnetic field 132 helps to carry informational signals across the isolation material 120 without allowing electrical current 136 to pass between the first leadframe portion 116 and second leadframe portion 128.

In some embodiments, the sensing element 124 may be configured to detect magnetic fluxes, fields, or the like, created by the first leadframe portion 116, convert the magnetic fluxes, fields, etc., into an electrical signal or electrical output and transfer the electrical signal or electrical output to the second leadframe portion 128, which carries the output electrical signal to the second circuit 108 via one or more electrically-conductive mechanisms.

Ultimately, this enables the first circuit 104 to be electrically isolated from the second circuit 108, meaning that the first circuit 104 has a different ground/reference potential as compared to the second circuit 108 and both circuits 104, 108 operate at different nominal voltages. As a non-limiting example, the first circuit 104 may operate at a nominal voltage that is at least 5 kV different from the second circuit 108. The elements of the coupler 112 enable the transmission of information from the first leadframe portion 116 to the second leadframe portion 128 (or vice versa) while substantially limiting electrical communication between the leadframe portions 116, 128.

With reference now to FIGS. 2-6, additional details of various configurations of an isolation coupler 112 will be described in accordance with at least some embodiments of the present disclosure. More specifically, the isolation coupler 200 depicted in FIGS. 2-6 may be one example of the coupler 112 illustrated in FIG. 1. Even more specifically, different configurations of the isolation coupler 200 are shown and it should be appreciated that each different configuration may include or not include elements of the other configurations depicted herein. Further still, any configuration of isolation coupler 200 may have components that are similar or different (either in structure or relative configuration) from other examples of the isolation couplers 112, 200 described herein.

Figure 2:
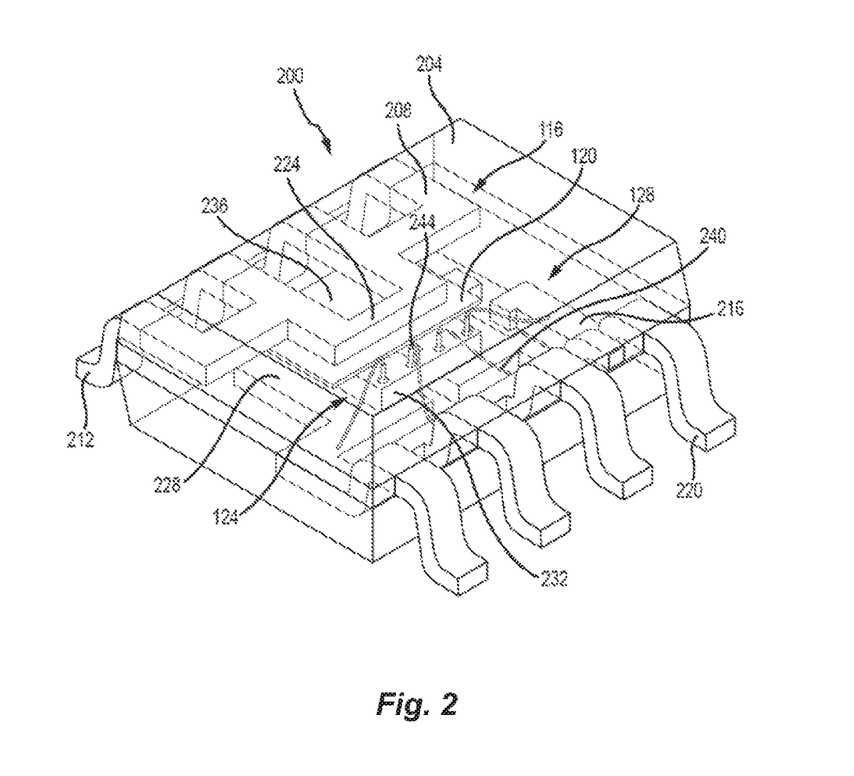
FIG. 2 is an isometric view of an isolation coupler in accordance with embodiments of the present disclosure.

With reference initially to FIG. 2, an isometric view of an isolation coupler 200 is shown in accordance with at least some embodiments of the present disclosure. The isolation coupler 200 is shown to include the first leadframe portion 116 positioned at least partially over the second leadframe portion 128. The isolation coupler 200 further exhibits the isolation material 120 between the first leadframe portion 116 and second leadframe portion 128.

FIG. 2 more specifically shows the different parts of the leadframe portions 116, 128. In some embodiments, the first leadframe portion 116 includes an encapsulated piece 208 and an exposed piece 212. Likewise, the second leadframe portion 128 includes an encapsulated piece 216 and an exposed piece 220. The encapsulated pieces 208, 216 of the leadframe portions may be encapsulated and in direct physical contact with an encapsulant 204. The exposed pieces 212, 220, by comparison, may be exposed and free from the encapsulant 204 and formed for connection to external circuitry. More specifically, the exposed pieces 212, 220 may be configured for attachment to the first circuit 104 and second circuit 108, respectively. Even more specifically, the exposed pieces 212, 220 may be referred to as leads. Although embodiments of the present disclosure show the leads as having a specific configuration for surface mounting to a PCB or the like, it should be appreciated that the leads may comprise any type of known, standardized, or yet-to-be developed configuration such as J leads, SOJ leads, gull-wing, reverse gullwing, straight-cut, etc.

As will be discussed in further detail herein, the encapsulated piece 208 of the first leadframe portion 116 may have a substantial planar disposition (e.g., no bends) within the encapsulant 204 whereas the encapsulated piece 216 of the second leadframe portion 128 may have one or more bends within the encapsulant 204. This bending of the encapsulated piece 216 of the second leadframe portion 128 enables the second leadframe portion 128 to be positioned at least partially underneath the first leadframe portion 116.

In some embodiments, both leadframe portions 116, 128 may be constructed from a thin sheet of conductive material, such a metal or the like. The leadframe portions 116, 128 may be cut or etched to have a particular configuration that enables the production of a magnetic field 132 by the first leadframe portion 116 and the supporting of a sensing element 124 by the second leadframe portion 128.

In some embodiments, the sensing element 124 is shown to include a semiconductor 232 and one or more sensors 236, 244. The sensing element 124 can be physically connected to (e.g., directly or indirectly) a support 228 formed in the second leadframe portion 128. The sensing element 124 can also be electrically connected to the encapsulated piece 216 of the second leadframe portion 128 via one or more wirebonds 240. In some embodiments, the wirebonds 240 directly connect with the semiconductor 232 and the different leads of the second leadframe portion 128. Each wirebond 240 may carry the same or a different electrical signal, which is ultimately carried out of the encapsulant 204 by the second leadframe portion 128 to the exposed piece 220 of the second leadframe portion 128.

As mentioned above, the first leadframe portion 116 may also be specially configured for a particular purpose. More specifically, the first leadframe portion 116 may be configured to induce the magnetic field 132. In some embodiments, the first leadframe portion 116 may include a bridge 224 that extends beyond other portions of the encapsulated piece 208. The bridge 224 may be configured to force electrical current to flow in a path that results in the creation of the magnetic field 132. Furthermore, the bridge 224 may overlap some of the sensing element 124 such that the magnetic field 132 induced by the current flowing through the bridge 224 is detected at one or both of the magnetic sensors 236, 244.

The magnetic sensors 236, 244 may correspond to magnetically-responsive elements established in the silicon of the semiconductor 232. As a non-limiting example, one or both of the magnetic sensors 236, 244 may correspond to hall-effect sensors developed in silicon of the semiconductor 232 at particular locations of the semiconductor 232. The magnetic sensors 236, 244 may be configured to convert magnetic energy into electrical signals that are carried through the semiconductor 232, possibly processed by IC components of the semiconductor 232, and then delivered to the wirebonds 240 via output pads of the semiconductor 232. Examples of suitable sensors 236, 244 and/or sensing elements 124 are described in further detail in U.S. Pat. Nos. 7,772,661; 7,042,208; 6,879,145; 5,572,058; 4,931,719; and 4,875,011, each of which are hereby incorporated herein by reference in their entirety.

The semiconductor 232 and magnetic sensors 236, 244 may, in some embodiments, be die attached directly on the support 228 of the second leadframe portion 128. Unlike more complex and expensive attachment processes (e.g., solder ball connects or gold stud bond attachments), the use of simple die attachment enables the semiconductor 232 to be placed on the second leadframe portion 128 with relative ease. Furthermore, by employing a direct connection with the second leadframe portion 128, heat generated in the semiconductor 232 can be more effectively and efficiently drained away from the semiconductor out to the exposed pieces 220 of the second leadframe portion 128. In other words, the second leadframe portion 128 can operate as a heat sink for the semiconductor 232, thereby helping with the prevention of heat-related failures. Although the employment of die attach processes is described herein, it should be appreciated that the semiconductor 232 could alternatively be attached to the second leadframe portion 128 using solder balls or gold stud bonds thereby obviating the need for wirebonds 240.

The isolation material 120 is shown to be positioned between the semiconductor 232 and the first leadframe portion 116. In some embodiments, the isolation material 120 may include a double sided B-stage adhesive insulating tape having a thickness of at least 2 mil. It should be appreciated that other non-conductive materials or combinations of materials may be used for the isolation material 120. The isolation material 120, in some embodiments, is used to enable the isolation coupler 200 to operate with high input voltages at the input side (e.g., at the first leadframe portion 116) and low voltages at the output side (e.g., at the second leadframe portion 128). Other non-limiting examples of materials that may be used in the construction of the isolation material 120 include polyimide, PPA, or any other type of polymer. Furthermore, the width of the isolation material 120 may be greater than a width of the bridge 224 and the isolation material 120 may be configured to extend beyond the bridge, thereby prohibiting current from arcing around the isolation material 120 from the first leadframe portion 116 to the second leadframe portion 128.

It should be appreciated that the isolation coupler 200 may include a greater or lesser number of leads than those depicted. Specifically, the isolation coupler 220 depicted herein is intended for use as an 8-pin coupler. Embodiments of the present disclosure contemplate a coupler 200 having 2 pins, 4 pins, 6 pins, 10 pins, 12 pins, or any other number of pins, whether odd or even.

Figure 3:
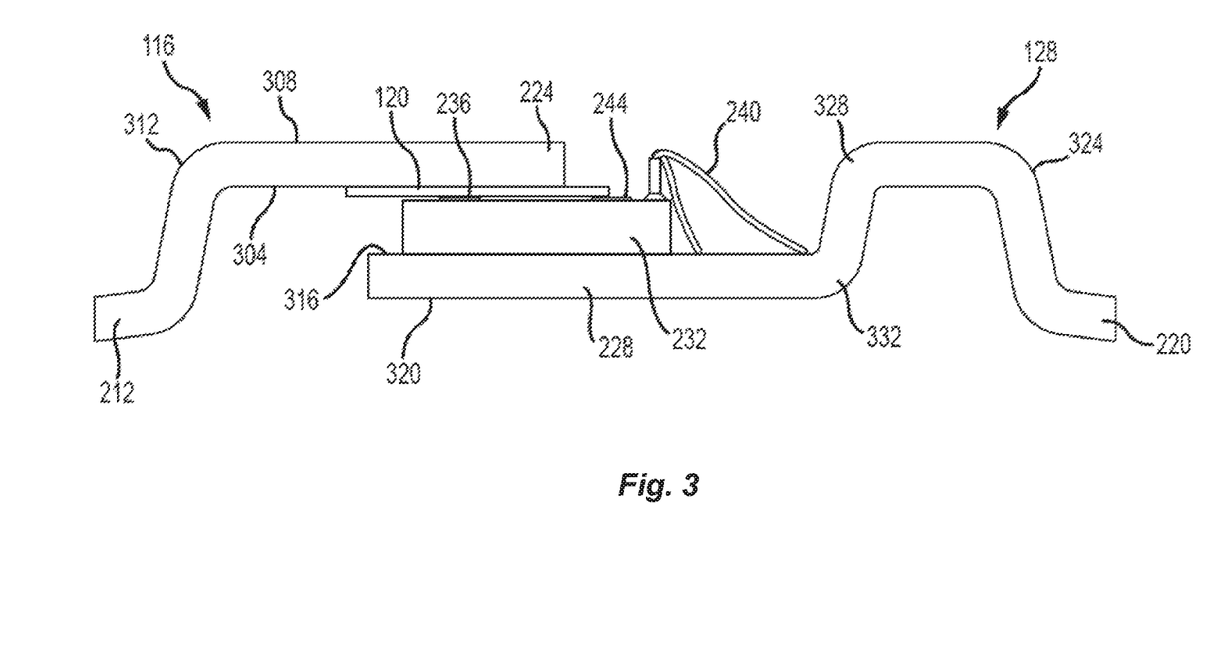
FIG. 3 is a cross-sectional view of an isolation coupler in a first configuration in accordance with embodiments of the present disclosure.
Figure 4:
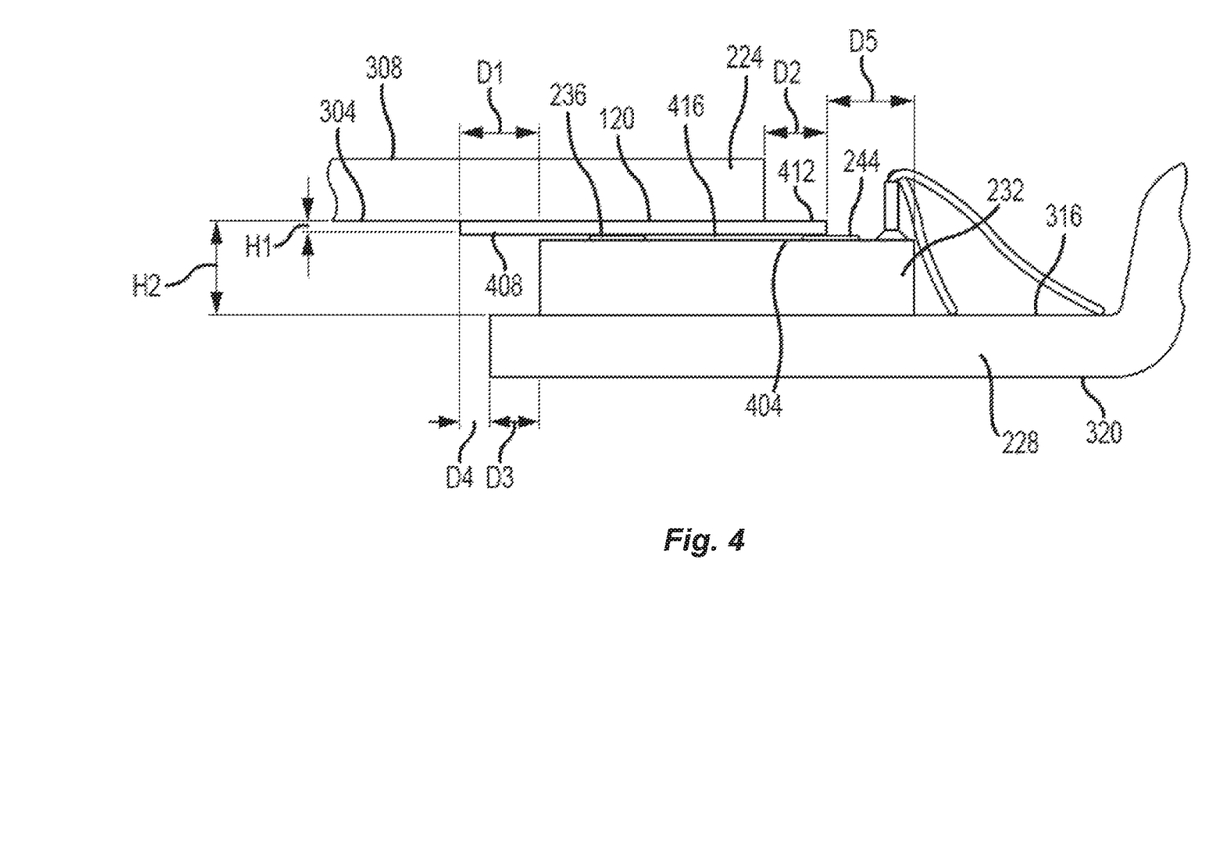
FIG. 4 is a detailed view of the isolation coupler depicted in FIG. 3.
Figure 5:
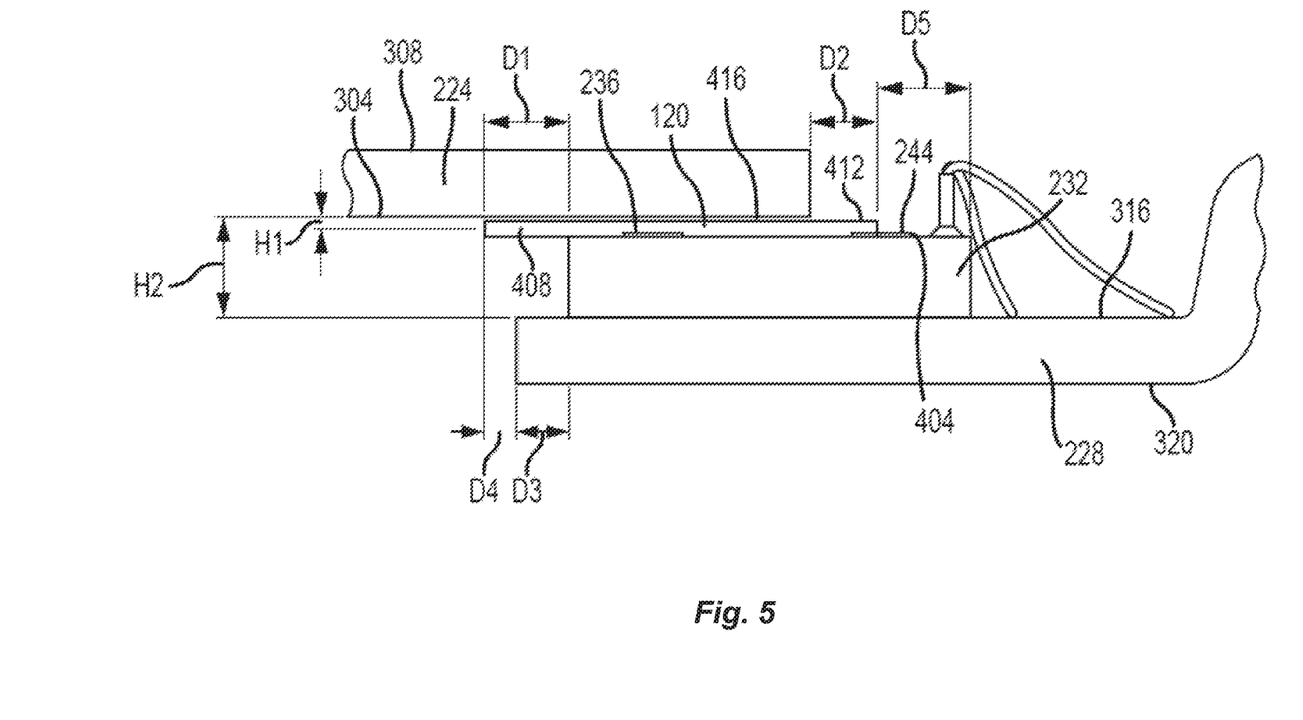
FIG. 5 is a cross-sectional view of an isolation coupler in a second configuration in accordance with embodiments of the present disclosure.

With reference now to FIGS. 3-5, different configurations of the isolation coupler 200 will be described in accordance with at least some embodiments of the present disclosure. These different configurations can be utilized in connection with the isolation coupler 200 and/or coupler 112. FIGS. 3 and 4 depict a first possible configuration where the isolation material 120 is connected directly to the first leadframe portion 116 and a gap 416 is provided between the isolation material 120 and the semiconductor 232. FIG. 5 depicts another possible configuration where the isolation material 120 is connected directly to the semiconductor 232 and a gap 416 is provided between the isolation material 120 and the first leadframe portion 116.

The cross-sectional views of FIGS. 3-5 also show possible relative dimensions of the various components of the isolation coupler 200. In particular, the first leadframe portion 116 is shown to include a first surface 304 (e.g., a bottom surface) and a second surface 308 (e.g., a top surface). A transition from the encapsulated piece 208 to the exposed piece 212 is also shown to include a first bend 312. As shown in FIG. 2, the first bend 312 may be present on multiple leads and can be specifically included in the exposed piece 212. It should be appreciated, however, that the first bend 312 can be included in the encapsulated piece 208 without departing from the scope of the present disclosure.

Similar to the first leadframe portion 116, the second leadframe portion 128 is shown to include a first surface 316 (e.g., a top surface) and a second surface 320 (e.g., a bottom surface). Divergent from the first leadframe portion 116, however, the second leadframe portion 128 is shown to include a jogged configuration. The jogged configuration is created by a first bend 324, a second bend 328, and a third bend 332. A greater or lesser number of bends can be used to implement the jogged configuration. By creating a jogged configuration, the overall thickness/height of the isolation coupler 200 can be minimized. In particular, the encapsulated pieces of both leadframe portions 116, 128 may enter the encapsulant 204 on substantially the same plane (e.g., with a co-planar arrangement). The jogged configuration allows this co-planar arrangement for the exposed pieces 212, 220, but enables the support 228 of the second leadframe portion 128 to be positioned at least partially underneath the first leadframe portion 116. This ultimately results in the thinner overall presentation of the isolation coupler 200. By having three bends 324, 328, 332 in the second leadframe portion 128, the support 228 can be substantially parallel with the encapsulated piece 208 of the first leadframe portion 116, but not co-planar with the encapsulated piece 208 of the first leadframe portion 116.

In the depicted configuration of FIGS. 3 and 4, the first surface 316 of the second leadframe portion 128 is shown to be facing toward the first surface 304 of the first leadframe portion 116. The semiconductor 232 is directly connected to the first surface 316 of the second leadframe portion 128 and at least some of the semiconductor 232 is positioned beneath the first surface 304 of the first leadframe portion 116. The isolation material 120 is shown to include a bottom face 408 and a top face 412. The top face 412 of the isolation material 120 is in direct contact with the first surface 304 of the first leadframe portion 116. The bottom face 408 is shown to be proximate to, but not in direct contact with, a top surface 404 of the semiconductor 232. Instead, a gap 416 is provided between the top surface 404 of the semiconductor 232 and the bottom face 408 of the isolation material 120. A distance between the top surface 404 and the first surface 304 of the first leadframe portion 116 may correspond to a first height H1 and the first height H1 may be approximately 2.5 mil to 3 mil. In some embodiments, the first height H1 is the combination of the size of gap 416 and the thickness of the isolation material 120. As a non-limiting example, the gap 416 may be approximately 0.5 mil to 1 mil and the isolation material 120 may be approximately 1.5 mil to 2.5 mil.

The total distance between the first surface 304 of the first leadframe portion 116 and the first surface 316 of the second leadframe portion 128 may correspond to a second height H2, which includes the first height H1 plus the thickness of the semiconductor 232. This size of first height H1 helps to ensure that creepage current doesn't flow between the first leadframe portion 116 and second leadframe portion 128. The size of the second height H2 correlates to an overall thickness and size of the isolation coupler 200.

In addition to providing an adequate first height H1 to limit the opportunities for electrical current to flow between the leadframe portions 116, 128, there is also a lateral clearance consideration. More specifically, as can be seen in FIG. 4, the isolation material 120 extends laterally beyond the end of the semiconductor 232 by a first lateral distance D1 and also extends laterally beyond the bridge 224 by a second lateral distance D2. The first lateral distance D1 includes a component that overlaps the second leadframe portion 128 by a third lateral distance D3 and a component that extends beyond the second leadframe portion 128 by a fourth lateral distance D4. The combination of the third lateral distance D3 and the fourth lateral distance D4 may be equal to the first lateral distance D1. As can also be seen in FIG. 4, there is at least some portion of the semiconductor 232 that is not overlapped by the first leadframe portion 116. This exposed piece of the top surface 404 may have a fifth lateral distance D5 which provides an area for connecting wirebonds 240 to the semiconductor 232.

The lateral clearance considerations and the overlapping arrangements of the isolation material 120 relative to the first leadframe portion 116, the semiconductor 232, and the second leadframe portion 128 help to prevent lateral arcing. Two points (among other points) where lateral arcing could occur are between the end of the bridge 224 and the semiconductor 232 as well as between the end of the support 228 and the first surface 304 of the first leadframe portion 116. Thus, the isolation material 120 is structured to extend further across these points, thereby limiting the ability for electrical current 136 to arc from the first leadframe portion 116 to the second leadframe portion 128 or the semiconductor 232. The dimensions of the lateral overlap and their components can vary depending upon the voltage difference between the first leadframe portion 116 and second leadframe portion 128 as well as the heights H1, H2. As some non-limiting examples, the first lateral distance D1 may be between 20 to 40 mils; the second lateral distance D2 may be between 20 to 30 mils; the third lateral distance D3 may be between 10 to 20 mils; the fourth lateral distance D4 may be between 10 to 20 mils; and the fifth lateral distance may be between 15 to 25 mils.

In some embodiments, there is a balance made with respect to the second lateral distance D2 for this configuration because the isolation material 120 is structurally self-supporting and floating above the top surface 404 of the semiconductor 232. Thus, having the isolation material 120 extend too far beyond the end of the bridge 224 may cause the isolation material 120 to bend, but having the isolation material 120 not extend far enough beyond the bridge 224 may expose the coupler 200 to unwanted current arcing. It is, therefore, important to carefully select the amount of overlap for the isolation material 120 and the second lateral distance D2.

FIG. 5 shows a slightly different configuration from the one depicted in FIGS. 3 and 4. In particular, FIG. 5 depicts a configuration where the isolation material 120 is directly attached to the semiconductor 232 instead of being directly attached to the first leadframe portion 116. In some embodiments, the bottom face 408 of the isolation material 120 is directly connected (e.g., adhered and/or contacted) with the top surface 404 of the semiconductor 232. The top face 412 of the isolation material 120 is not adjacent to the gap 416, which is provided between the isolation material 120 and the first leadframe portion 116.

As with the other configuration, the isolation material 120 may be laterally overlapping beyond the end of the semiconductor 232 and beyond the end of the bridge 224 to prevent lateral arcing. Furthermore, because the isolation material 120 may be structurally self-supporting, there may need to be a balance with respect to selecting the first lateral distance D1. Specifically, if the first lateral distance D1 is too large, then the isolation material 120 may warp, bend, or no longer maintain its desired shape. Conversely, if the first lateral distance D1 is too small, then there may be the potential for unwanted lateral creepage or current arcing between the first leadframe portion 116 and the semiconductor 232 or second leadframe portion 128. In some embodiments, the isolation material 120 overlaps at least sixty percent and no more than ninety percent of the top surface of the semiconductor 232.

Figure 6:
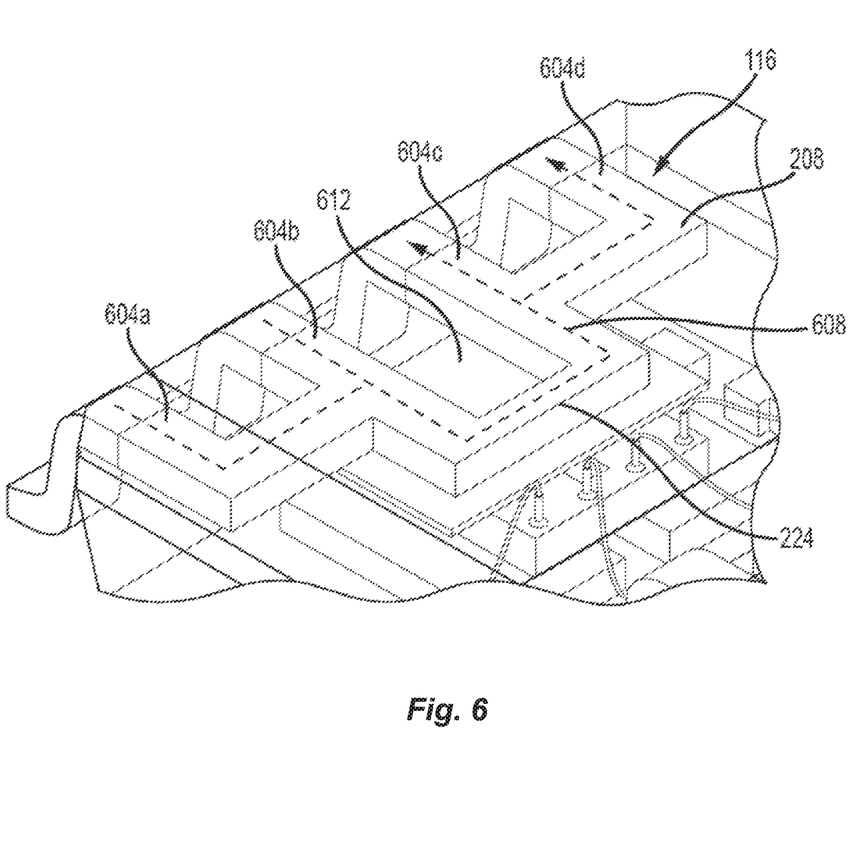
FIG. 6 is a detailed isometric view of a leadframe portion and current flowing therethrough in accordance with embodiments of the present disclosure.

With reference now to FIG. 6, additional details regarding the configuration of the first leadframe portion 116 will be described in accordance with at least some embodiments of the present disclosure. Power dissipation/input lead resistance is a factor of concern for isolation coupler 200. In some embodiments, the first leadframe portion 116 may be designed to provide a relatively low power dissipation by minimizing the input lead resistance created by the first leadframe portion 116. Specifically, there may be a desired to allow current flow 608 through the first leadframe portion 116 with as little resistance as possible. This can be achieved by designing the first leadframe portion 116 to have a relatively small resistance.

In the depicted embodiment, the first leadframe portion 116 is shown to include a plurality of leads 604a-d. Each lead 604a-d may have a portion belonging to the encapsulated piece 208 and a portion belonging to the exposed piece 212. The exposed portions of the leads 604a-d may extend from the encapsulant 204 substantially parallel. Furthermore, the first and second leads 604a, 604b may correspond to input leads (e.g., leads that receive current from the first circuit 104) whereas the third and fourth leads 604c, 604d may correspond to output leads (e.g., leads that return current back to the first circuit 104). In some embodiments, the input leads 604a, 604b are designed with a pair of parallel current paths leading to the bridge 224. The bridge 224 is substantially an extension of the second and third leads 604b, 604c. The bridge 224 provided between the input leads 604*a*, 604*b* and the output leads 604*c*, 604*d* helps to create the magnetic field 132 within a field inducement area 612. The pair of parallel current paths at the input and output leads helps to minimize the input resistance, thereby resulting in a favorably larger magnetic field 132. As can be appreciated, a larger magnetic field 132 can help to accurately carry information across the isolation material 120 and the isolation gap provided between the input leadframe portion 116 and output leadframe portion 128.

The field inducement area 612 between the input leads and output leads via the bridge 224 may also be positioned intelligently with respect to the magnetic sensors 236, 244. As an example, one or more of the magnetic sensors 236, 244 may be positioned directly beneath the field inducement area 612. The magnetic field 132 may have its strongest amplitude in the field inducement area 612 and locations substantially proximate therewith. Thus, the positioning of magnetic sensors 236, 244 within proximity to the field inducement area 612 may help the overall functioning of the isolation coupler 200.

Figure 7:
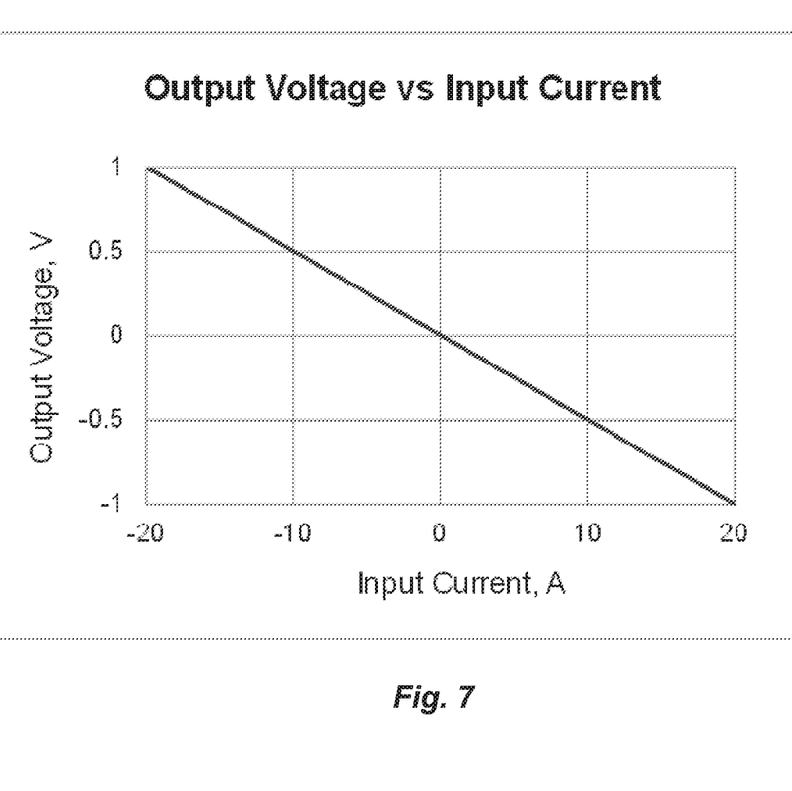
FIG. 7 is a chart depicting output voltage versus input current for an illustrative isolation coupler in accordance with embodiments of the present disclosure.

As can be seen with reference to FIG. 7, the input current 608 flowing through the first leadframe portion 116 may be substantially proportional in amplitude with the output voltage produced by the magnetic sensors 236, 244 in the semiconductor 232. This proportional relationship helps to carry information between the first leadframe portion 116 and second leadframe portion 128 without having electrical current flow from the first leadframe portion 116 to the second leadframe portion 128.

Figure 8:
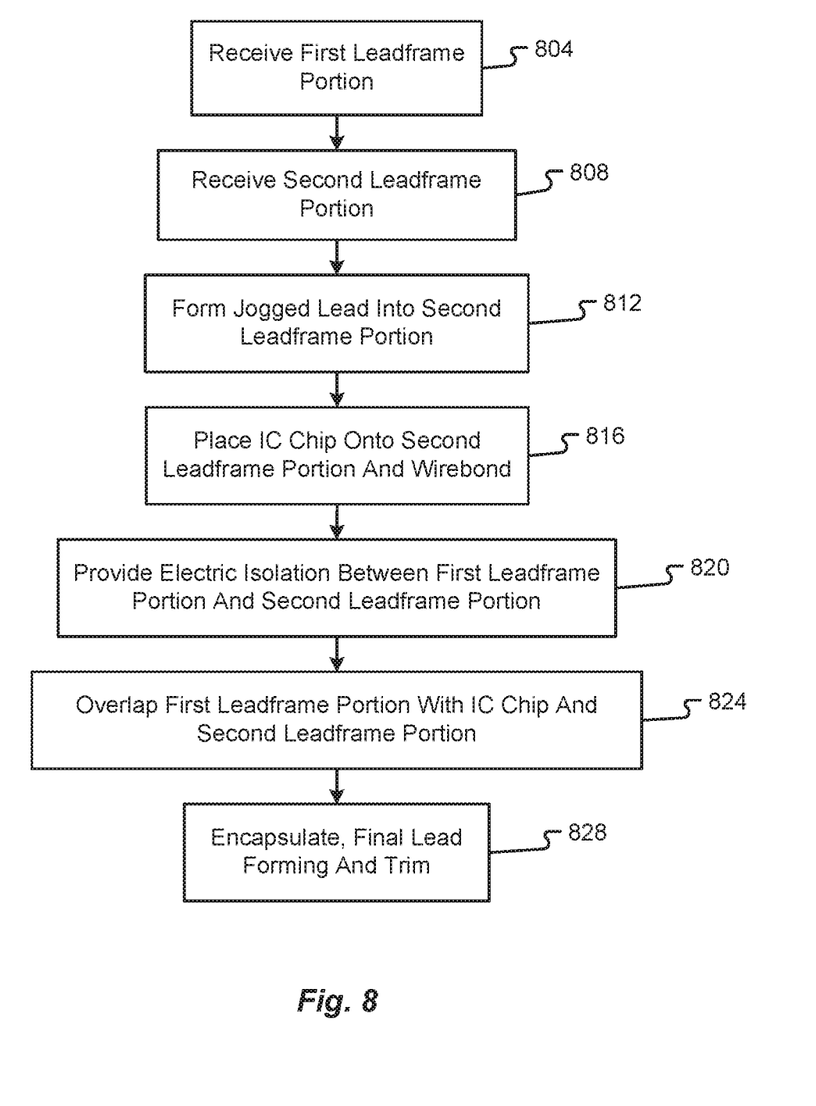
FIG. 8 is a flowchart depicting a method of manufacturing an isolation coupler in accordance with embodiments of the present disclosure.

With reference now to FIG. 8, a method of manufacturing an isolation coupler 112, 200 will be described in accordance with at least some embodiments of the present disclosure. The method begins with the receipt of the first leadframe portion 116 (step 804) and the second leadframe portion 128 (step 808). If not already provided with a jogged configuration, the method may continue by forming a jogged configuration into the second leadframe portion 128 (step 812). In some embodiments, the jogged configuration may be formed by folding, bending, or otherwise re-shaping the material of the second leadframe portion 128 to include at least two bends (e.g., second bend 328 and third bend 332).

The semiconductor 232 (or similar IC chip) may then be placed onto the support 228 of the second leadframe portion 128 and an electrical connection may be established between the elements (step 816). The electrical connection may be achieved by using one or more wirebonds 240 to connect the semiconductor 232 with the second leadframe portion 128. In some embodiments, the formation of the jogged configuration in the second leadframe portion 128 may occur after the semiconductor 232 has been placed on the second leadframe portion 128. In other words, step 816 may be performed prior to step 812 without departing from the scope of the present disclosure.

The method continues by providing an electrical isolation between the first leadframe portion 116 and the second leadframe portion 128 (step 820). The electrical isolation may be achieved by placing the isolation material 120 between the first leadframe portion 116 and second leadframe portion 128. In some embodiments, the isolation material 120 may be directly connected to the first leadframe portion 116. In some embodiments, the isolation material 120 may be directly connected to the semiconductor 232.

The method may further continue by placing the first leadframe portion 116 in a partial overlapping configuration with the second leadframe portion 128 (step 824). This may be done manually or with machine-placement technologies. Thereafter, the leadframe portions 116, 128 and the components thereon (e.g., isolation material 120, semiconductor 232, wirebonds 240, etc.) may be encapsulated with the encapsulant 204 and final lead formation may be performed (step 828). Specifically, after the leadframe portions 116, 128 have been encapsulated with encapsulant 204, the exposed pieces 212, 220 may be finally bent to include their respective bends 312, 324 and trimmed for connection with external circuitry such as a PCB. As discussed herein, the exposed pieces 212, 220 may be formed for surface mount connections or thru-hole connections with external PCBs.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A coupler, comprising:
   a first conductor configured to induce a magnetic field as electrical current flows through the first conductor;
   a second conductor that is electrically isolated from the first conductor;
   a semiconductor connected to a first surface of the second conductor, wherein the semiconductor comprises a top surface with a magnetic sensor provided thereon;
   an isolation material sandwiched between the top surface of the semiconductor and the first conductor, the isolation material providing an electrical isolation between the first conductor and both the semiconductor as well as the second conductor;
   an encapsulant that substantially encapsulates the semiconductor, a piece of the first conductor, a piece of the second conductor, and the isolation material; and
   one or more bondwires connected between one or more bond pads of the semiconductor and the second conductor.

2. The coupler of claim 1, wherein the isolation material comprises a high voltage isolation tape.

3. The coupler of claim 2, wherein the high voltage isolation tape overlaps at least sixty percent and no more than ninety percent of the top surface of the semiconductor.

4. The coupler of claim 2, wherein the high voltage isolation tape is structurally self supporting and extends laterally beyond at least one of the first conductor and the semiconductor.

5. The coupler of claim 1, wherein the isolation material comprises a high voltage tolerance as compared to the encapsulant.

6. The coupler of claim 1, wherein a portion of the semiconductor is not overlapped by the isolation material and wherein the portion of the semiconductor that is not overlapped by the isolation material comprises the one or more bond pads that provide a connection point to the semiconductor for the one or more bondwires.

7. The coupler of claim 1, wherein another piece of the first conductor and another piece of the second conductor are external to the encapsulant for external to make electrical connections to components external to the coupler.

8. The coupler of claim 1, wherein the second conductor comprises at least two bends that form a jogged configuration.

9. A coupler, comprising:
a first conductor configured to induce a magnetic field as electrical current flows through the first conductor;
a second conductor that is electrically isolated from the first conductor;
a semiconductor connected to a first surface of the second conductor, wherein the semiconductor comprises a top surface with a magnetic sensor provided thereon;
an isolation material sandwiched between the top surface of the semiconductor and the first conductor, the isolation material providing an electrical isolation between the first conductor and both the semiconductor as well as the second conductor, wherein the first conductor comprises a pair of parallel input leads and a pair of parallel output leads that are connected with a bridge that extends laterally over the semiconductor.

10. The coupler of claim 9, wherein the bridge is shaped to induce the magnetic field as current flows from the input leads to the output leads via the bridge.

11. The coupler of claim 10, wherein the magnetic sensor is positioned substantially underneath a field inducement area created between the pair of parallel input leads, the pair of parallel output leads, and the bridge.

12. A magnetic field-based isolation coupler, comprising:
a first leadframe portion having a field inducement area through which a magnetic field is created when current flows through the first leadframe portion;
a semiconductor having a magnetic sensor provided thereon; and
an isolation material sandwiched between the semiconductor and the first leadframe portion, wherein the isolation material comprises a top face that is facing toward the first leadframe portion and an opposing bottom face that is facing toward the semiconductor,
wherein the first leadframe portion includes a first bend that bends the first leadframe portion in a first direction, and a second bend that bends the first leadframe portion in a second direction that is parallel to the top surface, and
wherein the isolation material is sandwiched between the semiconductor and an end of the first leadframe portion that is closer to the second bend than the first bend.

13. The coupler of claim 12, further comprising:
a second leadframe portion having a first surface and an opposing second surface, the second leadframe portion comprising a support on which the semiconductor is mounted on the first surface of the second leadframe portion, wherein the first direction at least partially perpendicular to the second direction.

14. The coupler of claim 13, wherein the second leadframe portion comprises a jogged configuration that situates the second leadframe portion in a partial overlapping configuration with the first leadframe portion.

15. The coupler of claim 13, wherein the isolation material extends laterally beyond an end of the semiconductor by a first lateral distance and wherein the isolation material extends laterally beyond the end of the first leadframe portion by a second lateral distance.

16. The coupler of claim 15, wherein at least some of the semiconductor is not overlapped by the isolation material thereby providing a connection site for one or more wirebonds.

17. The coupler of claim 12, wherein the isolation material is attached directly to the first leadframe portion and a gap exists between the isolation material and the semiconductor.

18. The coupler of claim 12, wherein the isolation material is attached directly to the semiconductor and a gap exists between the isolation material and the first leadframe portion.

19. The coupler of claim 12, wherein the isolation material comprises a high voltage isolation tape.

20. A magnetic field-based isolation coupler, comprising:
a first leadframe portion having a field inducement area through which a magnetic field is created when current flows through the first leadframe portion;
a semiconductor having a magnetic sensor provided thereon;
an isolation material sandwiched between the semiconductor and the first leadframe portion, wherein the isolation material comprises a top face that is facing toward the first leadframe portion and an opposing bottom face that is facing toward the semiconductor;
a second leadframe portion having a first surface and an opposing second surface, the second leadframe portion comprising a support on which the semiconductor is mounted on the first surface of the second leadframe portion; and
an encapsulant that encapsulates the semiconductor and the isolation material, wherein the encapsulant also partially encapsulates the first leadframe portion and the second leadframe portion.

* * * * *